United States Patent [19]

Henager, Jr. et al.

[11] Patent Number: 5,156,909
[45] Date of Patent: * Oct. 20, 1992

[54] THICK, LOW-STRESS FILMS, AND COATED SUBSTRATES FORMED THEREFROM, AND METHODS FOR MAKING SAME

[75] Inventors: Charles H. Henager, Jr., Kennewick, Wash.; Robert W. Knoll, Menomonee Falls, Wis.

[73] Assignee: Battelle Memorial Institute, Richland, Wash.

[*] Notice: The portion of the term of this patent subsequent to Oct. 29, 2008 has been disclaimed.

[21] Appl. No.: 445,794

[22] Filed: Nov. 28, 1989

[51] Int. Cl.⁵ .............................................. B32B 5/16
[52] U.S. Cl. ................................. 428/334; 428/336; 428/688; 428/689; 428/698; 428/704
[58] Field of Search ............... 428/334, 336, 694, 698, 428/688, 689, 704

[56] References Cited

U.S. PATENT DOCUMENTS

| | | | |
|---|---|---|---|
| 2,769,778 | 11/1956 | Preston | 204/192 |
| 3,320,484 | 5/1967 | Riley et al. | 317/101 |
| 3,463,715 | 8/1969 | Bloom | 204/192 |
| 3,560,364 | 2/1971 | Burkhardt | 204/192 |
| 3,600,218 | 8/1971 | Pennebaker | 117/93.1 |
| 3,629,088 | 12/1971 | Frank | 204/192 |
| 4,218,291 | 8/1980 | Fukuyama et al. | 204/192 |
| 4,336,304 | 6/1982 | Landingham et al. | 428/336 |
| 4,510,172 | 4/1985 | Ray | 437/235 |
| 4,517,217 | 5/1985 | Hoffman | 428/632 |
| 4,656,101 | 4/1987 | Yamazaki | 428/620 |
| 4,659,606 | 4/1987 | Wada et al. | 428/336 |
| 4,711,821 | 12/1987 | Kikuchi et al. | 428/457 |
| 4,792,474 | 12/1988 | Murakami et al. | 428/698 |
| 4,800,112 | 1/1989 | Kano et al. | 428/698 |
| 4,804,640 | 2/1989 | Kaganowicz et al. | 437/236 |
| 4,846,948 | 7/1989 | Saito et al. | 204/192.2 |
| 4,851,096 | 7/1989 | Yamada et al. | 204/192.15 |
| 4,948,482 | 8/1990 | Kobayashi et al. | 437/241 |
| 4,950,558 | 8/1990 | Sarin | 428/698 |

FOREIGN PATENT DOCUMENTS

| | | | |
|---|---|---|---|
| 197939 | 1/1987 | Japan | 428/694 |
| 275340 | 11/1987 | Japan | 428/694 |
| 289948 | 12/1987 | Japan | 428/694 |

OTHER PUBLICATIONS

Shiban K. Tiku and Gregory Smith, Choice of Dielectrics for TFEL Displays, *IEEE Transactions On Electron Devices*, vol. Ed-31, No. 1, pp. 105-108, Jan. 1984.

Primary Examiner—Paul J. Thibodeau
Assistant Examiner—R. Follett
Attorney, Agent, or Firm—Marger, Johnson, McCollom & Stolowitz, Inc.

[57] ABSTRACT

Stress-induced deformation, and the damage resulting therefrom, increases with film thickness. The overcoming of excessive stress by the use of the Si-Al-N film material of the present invention, permits the formation of thick films that are necessary for certain of the above described applications. The most likely use for the subject film materials, other than their specialized views as an optical film, is for microelectronic packaging of components on silicon substrates.

In general, the subject films have excellent adherence to the underlying substrate, a high degree of hardness and durability, and are excellent insulators. Prior art elevated temperature deposition processes cannot meet the microelectronic packaging temperature formation constraints. The process of the present invention is conducted under non-elevated temperature conditions, typically 500° C. or less.

27 Claims, 1 Drawing Sheet

THICK, LOW-STRESS FILMS, AND COATED SUBSTRATES FORMED THEREFROM, AND METHODS FOR MAKING SAME

BACKGROUND OF THE INVENTION

This invention relates to the production of relatively thick, low-stress films, particularly optical films, and to coated substrates produced.

Deposition of thin (less than 5 microns) electrically conductive films onto the support surface of an electrical non-conductor at non-elevated temperature conditions (not more than about 500 degrees C.) is known in the prior art. For example, in U.S. Pat. No. 2,769,778, a thin (0.05 micron), transparent electrically conductive metallic film is deposited onto the surface of a non-conductive material at a non-elevated temperature of 300–400degrees C. by cathode sputtering or thermal evaporation, respectively. Thick films, i.e. greater than a 5 micron thickness, are not contemplated using non-elevated temperature deposition techniques.

In another method at a non-elevated temperature (at 20–100 degrees C.), U.S. Pat. No. 3,320,484, a semiconductor integrated circuit is produced by depositing onto a support, a substantially planar thin layer (0.05–0.15 micron thickness) of aluminum vapor is deposited onto a high resistivity semiconductor wafer substrate, the thin dielectric layer including silicon nitride.

U.S. Pat. No. 3,463,715 relates to an elevated temperature (about 1000 degrees C.) method of sputter deposition of a semiconductor material such as silicon onto a substrate to produce a silicon layer having high conductivity. The deposition technique employed is cathode sputtering deposition.

Another elevated temperature method is provided in U.S. Pat. No. 3,560,364 for producing an extremely thin, free-standing or unsupported transparent film of silicon nitride having a low density, a low coefficient of thermal expansion, high flexibility and good dielectric properties. The sputtering deposition of the film onto a molybdenum substrate is carried out at a temperature of 500–900 degrees C., depending on the film thickness. The film thickness is in a range of 50 angstroms to 20 microns. As the thickness of the film increases, the operating temperature for producing that film moves upward toward 900 degrees, the upper end of the temperature range. The above technique described is known as RF sputtering.

A method of deposition is described in U.S. Pat. No. 3,600,218 in which insulating films of silicon nitride and aluminum nitride are deposited onto a substrate. Nitrogen is employed in the deposition reaction to form a thin, insulating film of silicon nitride or aluminum nitride, respectively, onto the substrate surface. The deposition technique described therein utilizes RF energy across a substrate and source to generate a plasma-containing source material at temperatures of 300 degrees C. or more. Again, the greater the film thickness, the higher the deposition temperature. At a film thickness of 0.5 microns, an operating temperature of 1250 degrees C. is indicated.

U.S. Pat. No. 3,629,088 covers a sputtering method for the deposition of silicon oxynitride. The low temperature deposition of silicon oxynitride onto an integrated circuit device is accomplished by the reactive sputtering of a thin layer (0.15 microns) of high-purity silicon source material in the presence of nitrous oxide and nitrogen.

A film of a transition metal silicide or an aluminum silicon alloy is deposited on a semiconductor substrate at a temperature of 500–1200 degrees C. by vacuum evaporation, and then used as an electrode or wiring of a semiconductor device. The thin film (0.3 microns in Examples) is produced by a sputtering method wherein the silicon component of the film was not supplied from the target, but from a gaseous silicon compound contained in the sputtering atmosphere. (See U.S. Pat. No. 4,218,291).

U.S. Pat. No. 4,656,101 describes an electronic device having a structure in which at least one electronic element, including an insulating film or covered with a protecting film, is formed on a substrate, at a temperature from ambient to 900 degrees C., where the insulating or protecting film can consist principally of aluminum nitride and a film consisting principally of silicon oxide or silicon nitride.

U.S. Pat. No. 4,711,821 relates to an optomagnetic recording medium which utilizes at least one thin film layer (0.01–0.02 microns) of silicon nitride. The underlying substrate can be a plastic material such as acrylic resin or polycarbonate.

U.S. Pat. No. 4,804,640 relates to a method of forming a three-region dielectric film, having an overall thickness of 0.01 microns, on silicon, and a semiconductor device employing such a film. The formation method includes the step of reactive sputtering of aluminum in an oxygen plasma atmosphere.

U.S. Pat. No. 4,846,948 shows a method of producing a an iron-silicon-aluminum alloy magnetic film of 1–20 microns thickness in which argon is entrapped by using a DC magnetron sputtering apparatus to apply RF bias to a substrate using an RF diode sputtering technique. Heat treatment of the alloy takes place at 450–800 degrees C.

A laminated composite and a method for forming same by chemical vapor deposition is the subject of U.S. Pat. No. 4,336,304. The composite includes a layer of opaque silicon aluminum oxynitride of a thickness between 12 and 50 microns, and an average of 25 microns, and a underlying substrate material to which the layer is bonded. The method includes the steps of exposing a surface of the material to an ammonia-containing atmosphere, heating the surface to at least 1200° C., and impinging a gas containing in a flowing atmosphere of air, nitrogen, silicon tetrachloride, and aluminum trichloride on the surface. This is an example of a high temperature deposition technique, typically at temperatures between 1000° C. and 1400° C., and at a pressure on the order of 240 megapascals (MPa).

Finally, in an article by Shiban K. Tiku and Gregory C. Smith in the *IEEE Transactions on Electronic Devices,* Volume Ed-31, No. 1, January, 1984, entitled, "Choice of Dielectrics for TFEL Displays", an attempt was made to deposit silicon aluminum nitroxide and $Si_3N_4$ for use in AC thin-film electroluminescence displays. Films of 0.2–0.3 microns thickness were fabricated. The authors stated that thinner films of the dielectric material were found to be a problem because of pinholes, while thicker films caused high optical absorption and film stress. Since a high degree of optical transparency is required in many applications, such as in the electronics industry, the use of thick films is prohibited. Furthermore, high film stress results in a substantial amount and cracking and debonding of the film with respect to the underlying substrate, and in many cases resultant damage thereto.

Accordingly, there exists a need for a low-stress film material for coating underlying substrates, particularly silicon, silicon nitride and the like, by methods which are conducted at a non-elevated temperature (500° C. or less), but which produce the above-described films at a relatively high thickness levels. These films should be transparent, hard, dense and mechanically stable even at thicknesses of 50 microns or greater.

SUMMARY OF THE INVENTION

The above described needs have been met by the Si-Al-N film material of the present invention for coating underlying substrates, such as silicon, silicon nitride and like. The subject film material exhibits a substantial reduction of total stress, without degrading the optical properties, electrical properties, or protective properties of the material. Since excessive film stress has been eliminated, a film material can be produced for use in various applications such as optical devices, and in protective and insulating coatings for microelectronic devices.

Stress-induced deformation, and the damage resulting therefrom, increases with film thickness. The overcoming of excessive stress by the use of the Si-Al-N film material of the present invention, permits the formation of thick films that are necessary for certain of the above described applications. The most likely use for the subject film materials, other than their specialized views as an optical film, is for microelectronic packaging of components on silicon substrates.

In general, the subject films have excellent adherence to the underlying substrate, a high degree of hardness and durability, and are excellent insulators. Prior art elevated temperature deposition processes cannot meet the microelectronic packaging temperature formation constraints. The process of the present invention is conducted under non-elevated temperature conditions, typically 500° C. or less.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
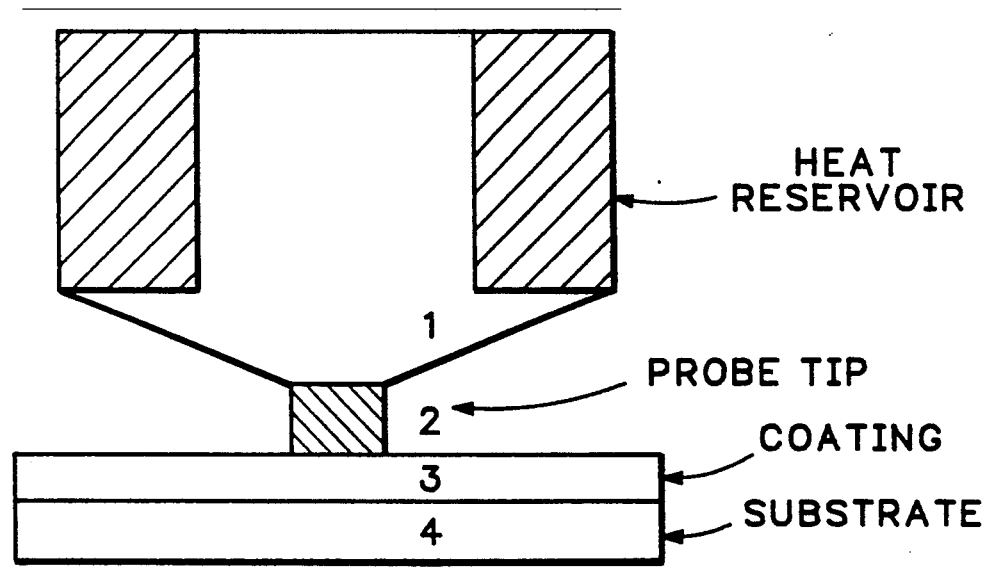
FIG. 1 is a schematic of the probe tip region of the thermal conductivity apparatus.

The method of the present invention relates to producing a low stress, film-coated substrate comprises depositing a film material onto a surface of an underlying substrate. Typical substrates useful in the practice of this invention, particularly in the microelectronics industry, are silicon, silicon dioxide, germanium, gallium arsenide, molybdenum, and the like. The preferred underlying substrates are silicon and silicon dioxide.

The above-described method is conducted at a non-elevated operating temperature of not more than 500° C. In this way, underlying substrates which cannot withstand the effects of coating operations at elevated temperatures can be conducted at the non-elevated temperature levels of the present invention. Preferably, a non-elevated operating temperature of not more than about 300° C., and more preferably not more than about 200° C., is employed in producing the requisite film materials.

The subject non-elevated temperature method of coating a substrate can be conducted employing several deposition techniques. However, the preferred forms of deposition are sputtering methods such as RF-Diode Sputtering, Magnetron Sputtering, and the like. In the most preferred form of the present invention, the hereinafter described film materials are produced using Reactive RF-Diode Sputtering from a target made by hot pressing mixed powders.

The film material comprises a Si-Al-N-containing material. In the preferred case, the structural formula of the Si-Al-N-containing material comprises $Si_{1-x}Al_xN$, wherein x is from about 0.1 up to about 0.6. In the preferred structural formula, x is from about 0.2 up to about 0.4.

The film coating material of this invention has a thickness of at least about 5 microns. A low stress layer of the film material of extremely high thickness can be produced at non-elevated temperature conditions using the method of the present invention, the upper practical limit of thickness is up to about 150 microns. The thickness range is preferably from about 10 microns, and more preferably from about 25 microns, up to preferably about 100 microns, and more preferably up to about 75 microns.

An important property of the Si-Al-N-containing material of this invention is that it exhibits a high level of optical transparency, particularly in both the visible and infrared ranges. A important measure of optical transparency is optical transmissivity which is defined as the ratio, expressed as a %, of the light intensity transmitted through the film, at a specified wavelength, to the light intensity transmitted in a vacuum. Thus, the optical transmissivity of the film material is typically at least about 90 percent, at a 800 n.m. wavelength, for films of at least a 50 micron thickness. Preferably, an optical transmissivity of at least about 60 percent, more preferably at least about 70 percent, and most preferably at least about 80 percent, at respective corresponding wavelengths of 450, 500, and 600 n.m. For purposes of this invention, optical transmissivity values have been determined using, for instance, the test procedures described in Example 1 with a Beckman Instruments Model 5270 double-monochromator spectrometer.

Another way of describing the optical transparency of the film materials of this invention is by determining the optical absorption coefficient of these materials at a wavelength of 750 n.m. In this case, when a high level of optical transparency is present in the subject materials, it will be indicated by their extremely low optical absorption coefficients. These optical absorption coefficients are typically not more than about 30/cm, preferably not more than about 20/cm, and more preferably not more than about 10/cm. For purposes of this invention, the optical absorption coefficient values have been determined, using the Beckman spectrometer described above, directly from the spectral transmission curve by measuring the decrease in optical transmission (as function of thickness) compared to an uncoated $SiO_2$ substrate.

A novel and extremely important feature of the film materials of the present invention relates to their low stress values. Film stress is defined as force per unit area acting in the plane of the film which acts to supply a bending moment to an underlying substrate. More specifically, the film materials produced by the process of this invention have a relatively low film stress and a high level of adherence to the underlying substrate, thereby avoiding substantial cracking and debonding of the film and any resultant damage to the underlying substrate.

Various properties of the film material which verify this film low stress include, for example, a determination of the total film stress of the material. Total film stress is defined as the sum of the intrinsic, or deposition stress, and the thermal stress, which is due to the difference between thermal expansion coefficients of the respective film and substrate. Based on a film material produced by the method of this invention and having a thickness of about 50 microns on an underlying silicon substrate, the total stress of the material is generally not more than 100 MPa, preferably not more than 75 MPa, and most preferably less than about 50 MPa. For purposes of this invention, the total stress values have been determined using the following test procedures in Example 1 below using a high resolution Tropel Model 9000i Laser Interferometer with CRT display, camera data storage, and vacuum chuck accessory for handling thin substrates.

Another indication of the low stress of the film material of the present invention is provided by measuring the intrinsic elastic stiffness of the material. Intrinsic elastic stiffness is defined as the ratio of the film's Young's Modulus ($E_f$) to [1 minus Poissons ratio of the film], ($1-v_f$), which represents the resistance of the film to the elastic deflection. With respect to the film material produced by the method of the subject invention, the intrinsic elastic stiffness should be less than about 300 $GP_a$, preferably less than about 200 $GP_a$, and more preferably less than about 150 $Gp_a$. For purposes of this invention, the intrinsic elastic stiffness values have been determined using the test procedures described in Example 1 below and the Tropel Interfermeter described above, with calculations being done according to the Retajozyk and Sinha method.

Another important property which can be measured with respect to the film materials of this invention is the coefficient of thermal expansion (CTE). The CTE is defined as the fractional change in length per degree of temperature change. Thus, the CTE of the film material is not more than about $3.8 \times 10^6$, preferably not more than about $3.3 \times 10^6$, and more preferably less than about $2.8 \times 10^6$. For purposes of this invention, the CTE values have also been determined using the test procedures and test equipment used in computing the above-described elastic stiffness value. Furthermore, it is important to the adherence and stress properties of the film-coated substrate that the CTE of the film material be of similar magnitude to the CTE of the underlying substrate. For this purpose, the CTE ratio (expressed as a percentage) for a given film material has been determined by dividing the CTE of that film material by the CTE of the underlying substrate, and multiplying the resultant quotient by 100. Thus, the CTE ratio for the film materials produced by the method of this invention will not be more than about 50 percent, and preferably not more than about 40 percent, and most preferably not more than 30 percent.

In many applications it is important that the film material coated onto the substrate have similar refractive properties of as the underlying substrate itself so that the end user won't notice the optical differences between same. Thus, the index of refraction of the film material should have a similar value to the index of refraction of the underlying substrate. For use in conjunction with silicon based materials, the index of refraction of the film material should be from about 1.9 up to about 2.1, respectively. For purposes of this invention, the index of refraction values have been determined using the test procedure set forth in Example I using the method of Manificier, and above described Beckman spectrometer.

Another way of determining the optical properties of the coating material is by measuring the actual density of the film material and comparing it with the theoretical density of the film material. This will indicate the amount of free space or voids present in the film material. The closer the actual density to the theoretical density of the film material, the freer of voids will be the film material. In that regard, a film material free of voids exhibits good optical properties since light will pass through same without being diverted by a preponderance of void areas. Preferably, the actual density of the film material is at least about 95 percent of the theoretical density of the material, and preferably about 97. For purposes of this invention, the densities have been determined by measuring the weight gain of the substrate after coating operations have been completed, calculating the film volume from the measured film thickness, and then determining the mass per unit volume.

For many industries, such as the semiconductor industry, it is important that the film material have as high a thermal conductivity as possible in order for it to dissipate the maximum amount of heat within its interstices without destroying the structural integrity of the film coating. The film materials of the present invention typically have a high thermal conductivity, preferably at least about $1.0 \times 10^{-3}$ W/cm/K, more preferably at least about $5.0 \times 10^{-3}$ W/cm/K., and most preferably at least about $7.0 \times 10^{-3}$ W/cm/K.

The following analysis was developed to extract thin film thermal conductivities from the thermal conductivity apparatus of FIG. 1. FIG. 1 is a schematic figure which identifies the various components that make up the thin film thermal conductivity measurement.

At each interface, heat flow is assumed to be proportional to the temperature difference and inversely proportional to the thermal resistance. Defining $$T_i - T_j = YT_{ij} = R_i Q$$

where $YT_{ij}$ is the temperature difference between adjacent regions (numbered 1 to 5 in FIG. A1), $R_i$ is the thermal resistance of the ith interface, and Q is the steady state heat flow across the interfaces, which is the same value at each interface at steady state. As an example $$T_1 - T_2 = YT_{12} = R_1 Q$$

and $R_1$ is the thermal resistance to heat flow from the reservoir into the probe. The thermal resistance terms are conventionally written as a product of the thermal conductivity and geometrical factors as follows:

Probe Resistance (Region 1)
$1/R_1 = 4K_1 r_1$     $K_1$ = probe thermal conductivity
     $r_1$ = probe tip radius
(This solution is for heat flow from a circular region into a semi-infinite cylinder and is from Carslow, H. S., and J. C. Jaeger, Conduction of Heat in Solids, -continued Oxford, N.Y., 1947, pp. 214–216)
Probe Tip/Coating Resistance (Contact Resistance) (Region 2)

$1/R_2 = K_2 A_2 / t_2$    $K_2$ = contact conductivity
                    $A_2$ = contact area
                    $t_2$ = contact layer thickness Coating Resistance (Region 3)

$1/R_3 = K_3 A_3 / t_3$    $K_3$ = coating conductivity
                    $A_3$ = contact area
                    $t_3$ = coating thickness (Here we assume there is no lateral heat flow in the coating, which is a valid assumption if the coating thermal conductivity is low and the coating thickness is small compared to its radius)

Substrate Resistance (Region 4)

$1/R_4 = 4 K_4 r_4$    $K_4$ = substrate conductivity
                  $r_4$ = substrate radius (Here we assume that heat flow from coating into the substrate also obeys the semi-infinite solution discussed above)

Heat Sink Resistance (Region 5)

$R_5 \approx 0$ since $T_4 \approx T_5$ Assume $R_5 \ll R_1, R_2, R_3, R_4$
The resistances are considered to be in series such that $$(T_1 - T_5) = \sum_{i}^{1-5} R_i Q = Q \sum_{i}^{1-5} R_i$$

which can be solved for $Q$ to give $$Q = \frac{(T_1 - T_5)}{\sum_{i}^{1-5} R_i}$$

Thus, we can write $$T_1 - T_2 = R_1 Q = R_1 \frac{(T_1 - T_5)}{\sum_{i}^{1-5} R_i}$$

which can be used to give $$\frac{(T_1 - T_5)}{(T_1 - T_2)} =$$

$$\frac{1}{R_1} \sum_{i}^{1-5} R1 = 1 + \frac{R_2}{R_1} + \frac{R_3}{R_1} + \frac{R_4}{R_1} + \frac{R_5}{R_1}$$

Using the definitions for the $R_i$ and neglecting $R_5$ give $$\frac{(T_1 - T_5)}{(T_1 - T_2)} =$$

$$1 + 4 K_1 r_1 \left( \frac{t_2}{K_2 A_2} \right) + 4 K_1 r_1 \left( \frac{t_3}{K_3 A_3} \right) + \frac{K_1 r_1}{K_4 r_4}$$

Therefore, this gives $$\frac{(T_1 - T_5)}{(T_1 - T_2)} = \left( \frac{4 K_1 r_1}{K_3 A_3} \right) t_3 + \left[ 1 + \left( \frac{4 K_1 r_1}{K_2 A_2} \right) t_2 + \frac{K_1 r_1}{K_4 r_4} \right]$$

which is of the form for a line
$y = mx + b$
where $y = \frac{(T_1 - T_5)}{(T_1 - T_2)}$ = temperature ratio $x = t_3$ = coating thickness $m = \frac{4 K_1 r_1}{K_3 A_3}$ = slope $b = \left[ 1 + \left( \frac{4 K_1 r_1}{K_2 A_2} \right) t_2 + \frac{K_1 r_1}{K_4 r_4} \right]$ = intercept A plot of the temperature ratio as a function of coating thickness is fit with a line using a least squares procedures. The resulting slope is used to solve for the coating thermal conductivity, $K_3$, as $$K_3 = K_{th} = \frac{m A_3}{4 K_1 r_1}$$

where $A_3$ is the contact area between the probe tip and the coating, $K_1$ is the probe tip radius, and $K_1$ is the thermal conductivity of the probe material. The contact area was determined by measuring the impression of the probe left on the coating surface using a white thermal grease. The probe tip radius and probe thermal conductivity are known and, thus, the coating conductivity can be calculated. Note that the probe contact resistance only appears in the intercept term and does not affect the measured value of the film thermal conductivity.

EXAMPLE 1

This is a description of a representative experimental method conducted under non-elevated temperature conditions to produce the novel film materials and film-coated substrates of the present invention.

All the film materials were produced in an RF-Diode sputtering chamber, manufactured by MRC, which was equipped with 152 mm (6 inch) diameter targets and a liquid nitrogen-trapped diffusion pump. The system was equipped with feedback control of gas pressure, gas flow, and RF power. Films were deposited on flat, polished $SiO_2$ and Si substrates (25.4 mm dia. by 0.25–0.38 mm thick), positioned 30 mm below the target. The film materials were deposited from Si, or hot-pressed $Si_{70}Al_{30}$ or $Si_{60}Al_{40}$ powder targets, at a 600 W target power and a ~210 degree C. substrate temperature. $Ar/N_2$ gas mixtures at a total pressure of 2.7 Pa (20 mTorr) were used for the sputtering deposition. $N_2$ partial pressures were 0.4–0.7 Pa for the nitride depositions. Deposition rates were 1.7 lm/hr for pure nitrides. Because of deleterious effects of residual $H_2O$ on film properties, care was taken to begin deposition only after a base pressure $< \sim 2 \times 10^{-5}$ Pa ($1.5 \times 10^{-7}$ Torr) was reached, usually after overnight pumpout and bakeout of the chamber.

The following film materials were deposited and studied: Si:N, $Si_{70}Al_{30}$ N, $Si_{60}Al_{40}$ N, respectively. The Si:Al ratio in the films was set by the target.

For each material, films of nominal thicknesses of 5, 10 and 50 microns were deposited on a pair of each substrate type, $SiO_2$ and Si. Thickness and refractive index of 5 to 10 micron films were measured from the (visible) spectral transmission according to the method of J.C. Manifacier, et al., Scientific Instruments, 9 1002 (1976). Briefly, the film/substrate system creates an interference pattern in the transmission spectrum that can be analyzed for the index of refraction and film thickness for the assumption that the film is much thinner than the substrate. A Beckman Instruments Model 5270 double-monochromator spectrometer was used for these measurements at wavelengths from 190 to 2800 nm. The optical absorption coefficient at 750 nm was measured directly from the spectral transmission plot by measuring the decrease in transmission as a function of film thickness compared to a bare silica substrate.

Mechanical stress in sputter deposited coatings (intrinsic and/or thermal expansion mismatch components) is measured by optically detecting substrate distortion after coating deposition using a high resolution Tropel Model 9000i Laser Interferometer with CRT display, camera data storage, and vacuum chuck accessory for handling thin substrates. This technique utilizes grazing incidence interferometry to measure the curvature of a nominally flat substrate. Stress levels as low as 10 MPa can be measured by this technique. The total stress in the deposited film, $s_T$, was calculated from the stress-induced bending of the substrate. The film CTE, $A_f$, and elastic stiffness parameter, $E_f/(1-n_f)$ (where $E_f$ is the elastic modulus and $n_f$ is Poisson's Ratio of the film), were calculated using the method of Retajczyk and Sinha, see G. Lucovsky, et al, J. Vac. Sci. Techol. A4 (3), 681 (1986). For this measurement, the stress-induced bending of the $SiO_2$ and Si substrates was measured over the temperature range 20 to 200 degrees C. by equipping the interferometer with a heated substrate holder. The total stress was then calculated over that temperature range for each substrate, and $A_f$ and $E_f/(1-n_f)$ were determined using the slopes of the sT vs. temperature data. With $A_f$ and $E_f/(1-n_f)$ known, the thermal component of the total stress was calculated. Finally, the intrinsic stress component was determined by the difference between the total stress and the thermal component of the total stress.

To understand the film structure and to help the property data, some films were examined on the plane surface and in cross section by optical and by scanning electron microscopy (SEM). The thick films (50 microns) were examined by x-ray diffraction (XRD) to identify crystalline phases. Selected films were polished and were examined by laser profilometry to measure surface roughness before and after optical polishing. Film densities were determined from the weight and volume of the thickness films.

A thermal comparator apparatus was assembled to measure thermal conductivity of thin films. A heated probe was brought into contact with a specimen, which consists of a film on a standard 38.5 mm (1.5 inch) Si mirror substrate held at constant temperature. A temperature difference is developed in a few seconds between the probe reference and the probe tip. This temperature difference is used to determine the thermal conductivity of the film.

A summary of measured film properties is given in Table I for the three different compositions evaluated, namely, Si:N, $Si_{60}Al_{40}$ and $Si_{70}Al_{30}$, respectively. The qualities listed in Table I are mean values for the film thickness range of 2-10 microns, therefore the listed standard deviations include contributions from measurement errors and from the thickness dependence. Table I is intended mainly to illustrate property differences resulting from film composition differences.

The refractive indices of the pure nitride films corresponded closely to the indices of bulk $Si_3N_4$ and AlN(~2.00).

modifications coming within the spirit and scope of the accompanying claims.

We claim:

1. A low stress film-coated substrate, which comprises a Si-Al-N-containing film material, having a thickness of at least 5 microns, and formed by depositing said film material onto an underlying surface of said substrate at a non-elevated temperature of up to about 500° C., said film exhibiting a total film stress and a level of adherence to said substrate which avoids substantial cracking and debonding of said film and any resultant damage to said substrate.

said Si-Al-N containing film material having level of optical transparency in the visible and infrared ranges, the optical absorption coefficient of said material being up to about 30/cm at a wavelength of 750 n.m.

2. The substrate of claim 1, wherein said Si-Al-N-containing material comprises the structural formula $Si_{1-x}Al_xN$, wherein x is from about 0.1 up to about 0.6.

3. The substrate of claim 1, wherein the thermal conductivity of said material is at least about $1.0 \times 10^{-3}$ W/cm/K.

4. The substrate of claim 1, wherein the total film stress of said material, measured in a film having a thickness of about 50 micron which has been deposited onto a Si underlying substrate, is less than about 100 MPa.

5. The substrate of claim 1, wherein the intrinsic elastic stiffness of said material is up to about 300 GPa.

6. The substrate of claim 1, wherein the optical transmissivity of said of said material is at least about 90% at a 800 n.m. wavelength for films of at least about a 50 micron thickness.

7. The substrate of claim 1, wherein the coefficient of thermal expansion of said material is up to about $3.8 \times 10^{-6}$.

8. The substrate of claim 1, wherein the index of refraction of said material is from about 1.9 up to about 2.1.

9. The substrate of claim 1, wherein the actual density of said material is at least about 95% of the theoretical density of said material.

10. A low stress film material for deposition onto an underlying substrate, which comprises a Si-Al-N-containing film material, having a thickness of at least about 5 microns, and formed at a non-elevated temperature of up to about 500° C., said film exhibiting a total film stress and a level of adherence when deposited on said substrate which avoids substantial cracking and debonding of said film and any resultant damage to said substrate, the optical transmissivity of said material being at least about 90% at a 800 n.m. wavelength for

TABLE I

| Material | Index (at 750 nm) | Optical Absorption Coefficient at 750 nm ($cm^{-1}$) | Film Thermal Expansion Coefficient ($10^{-6}$/K) | Thermal Conductivity (W/cm/K) | Elastic Stiffness (GPa) | Total Stress | Intrinsic Stress (MPa) | Thermal Stress | Density (q/cm³) |
|---|---|---|---|---|---|---|---|---|---|
| Si:N | 1.99 | — | 2.7 | — | 190 | −390 | −400 | ~0 | — |
| $Si_{70}Al_{30}$:N | 1.99 | 28 | 2.8 | 0.005 | 140 | −60 | −60 | ~0 | 3.05 |
| $Si_{60}Al_{40}$:N | 1.99 | 21 | 3.3 | 0.007 | 190 | −70 | −80 | ~0 | 3.10 |

Having illustrated and described the principles of my invention in a preferred embodiment thereof, it should be readily apparent to those skilled in the art that the invention can be modified in arrangement and detail without departing from such principles. We claim all films of at least about a 50 micron thickness.

11. The material of claim 10, wherein said Si-Al-N-containing material comprises the structural formula $Si_{1-x}Al_xN$, wherein x is from about 0.1 up to about 0.6.

12. The material of claim 10, wherein said Si-Al-N containing material has a level of optical transparency in the visible and infrared ranges, the optical absorption coefficient of said material being up to about 20/cm at a wavelength of 750 n.m.

13. The material of claim 10, wherein the thermal conductivity of said material is at least about $1.0 \times 10^{-3}$ W/cm/K.

14. The material of claim 10, wherein the total film stress of said material, measured in a film having a thickness of about 50 micron which has been deposited onto a Si underlying material, is less than about 100 MPa.

15. The material of claim 10, wherein the intrinsic elastic stiffness of said material is up to about 300 GPa.

16. The material of claim 10, wherein the coefficient of thermal expansion of said material is up to about $3.8 \times 10^{-6}$.

17. The material of claim 10, wherein the index of refraction of said material is from about 1.9 up to about 2.1.

18. The material of claim 10, wherein the actual density of said material is at least about 95% of the theoretical density of said material.

19. A low stress film-coated substrate, which comprises a Si-Al-N-containing film material, having a thickness of at least 5 microns, and formed by depositing said film material onto an underlying surface of said substrate at a non-elevated temperature of up to about 500° C., said film exhibiting a total film stress and a level of adherence to said substrate which avoids substantial cracking and debonding of said film and any resultant damage to said substrate, the index of refraction of said material being from about 1.9 up to about 2.1, sid si-Al-N containing material having a level of vertical transparency in the visible and infrared ranges, and an optical absorption coefficient of up to about 30/cm at wavelength of 750 n.m. and an optical transmissivity of at least about 90% at a 800 n.m. wavelength for films of at least about a 50 micron thickness.

20. The substrate of claim 19, wherein said Si-Al-N containing material comprises the structure formula $Si_{1-x}Al_xN$, wherein x is from about 0.1 up to about 0.6.

21. The substrate of claim 19, wherein said Si-Al-N containing material has a level of optical transparency in the visible and infrared ranges, the optical absorption coefficient of said material being up to about 20/cm at a wavelength of 750 n.m.

22. The substrate of claim 19, wherein the thermal conductivity of said material is at least about $1.0 \times 10^{-3}$ W/cm/K.

23. The substrate of claim 22, wherein the total film stress of said material, measured in a film having a thickness of about 50 micron which has been deposited onto a Si underlying substrate, is less than about 100 MPa.

24. The substrate of claim 19, wherein the intrinsic elastic stiffness of said material is up to about 300 GPa.

25. The substrate of claim 19, wherein the optical transmissivity of said material is at least about 80% at a 600 n.m. wavelength for films of at least about a 50 micron thickness.

26. The substrate of claim 19, wherein the coefficient of thermal expansion of said material is up to about $3.8 \times 10^{-6}$.

27. The substrate of claim 19, wherein the actual density of said material is at least about 95% of the theoretical density of said material.

* * * * *

UNITED STATES PATENT AND TRADEMARK OFFICE
CERTIFICATE OF CORRECTION

PATENT NO. : 5,156,909
DATED : October 20, 1992
INVENTOR(S) : Henager, Jr. et al.

It is certified that error appears in the above-indentified patent and that said Letters Patent is hereby corrected as shown below:

Column 5    Line 45, change "$10^6$" to --$10^{-6}$--;

Column 5    Line 46, change "$10^6$" to --$10^{-6}$--;

Column 5    Line 47, change "$10^6$" to --$10^{-6}$--;

Column 7    Line 20, change "< <" to --<<--;

Column 11   Line 32, change "a level of vertical" to --optical--;

Column 12   Line 16, change "22" to --19--.

Signed and Sealed this

Twenty-second Day of March, 1994

Attest:

BRUCE LEHMAN

*Attesting Officer*       *Commissioner of Patents and Trademarks*